United States Patent
Chung et al.

(10) Patent No.: US 7,205,803 B2
(45) Date of Patent: Apr. 17, 2007

(54) HIGH SPEED FULLY SCALEABLE, PROGRAMMABLE AND LINEAR DIGITAL DELAY CIRCUIT

(75) Inventors: Tae-Song Chung, Danville, CA (US); Hong Hao, Saratoga, CA (US); Keven Hui, Union City, CA (US)

(73) Assignee: LSI Logic Corporation, Milpitas, CA (US)

( * ) Notice: Subject to any disclaimer, the term of this patent is extended or adjusted under 35 U.S.C. 154(b) by 21 days.

(21) Appl. No.: 10/879,438

(22) Filed: Jun. 29, 2004

(65) Prior Publication Data

US 2005/0285653 A1   Dec. 29, 2005

(51) Int. Cl.
*H03L 7/06* (2006.01)
(52) U.S. Cl. .................... 327/158; 327/161; 327/278
(58) Field of Classification Search ................ 327/158, 327/159, 161, 261, 269, 270, 272, 285, 276–278
See application file for complete search history.

(56) References Cited

U.S. PATENT DOCUMENTS

| | | | | |
|---|---|---|---|---|
| 5,355,037 A | * | 10/1994 | Andresen et al. | 327/158 |
| 6,069,506 A | * | 5/2000 | Miller et al. | 327/156 |
| 6,137,334 A | * | 10/2000 | Miller et al. | 327/271 |
| 6,255,879 B1 | * | 7/2001 | Voss | 327/276 |
| 6,366,149 B1 | * | 4/2002 | Lee et al. | 327/276 |
| 6,388,480 B1 | * | 5/2002 | Stubbs et al. | 327/156 |
| 6,445,231 B1 | * | 9/2002 | Baker et al. | 327/158 |
| 6,448,756 B1 | * | 9/2002 | Loughmiller | 324/76.54 |
| 6,518,812 B1 | * | 2/2003 | Sikkink et al. | 327/284 |
| 6,573,776 B2 | * | 6/2003 | Miyamoto | 327/276 |
| 6,646,484 B2 | * | 11/2003 | Ito | 327/158 |
| 6,661,265 B2 | * | 12/2003 | Partsch et al. | 327/158 |
| 6,879,200 B2 | * | 4/2005 | Komura et al. | 327/278 |
| 6,919,749 B2 | * | 7/2005 | Alon et al. | 327/277 |

* cited by examiner

*Primary Examiner*—Timothy P. Callahan
*Assistant Examiner*—Hai L. Nguyen
(74) *Attorney, Agent, or Firm*—Suiter Swantz PC

(57) ABSTRACT

The digitally programmable delay circuit to correct timing skew between data and clock is developed. The digitally programmable delay circuit may be built by cascading delay cells. The delay circuit uses delay cells comprising simple digital elements such as inverters and tri-state inverters to eliminate the intrinsic delay and achieves linearity and monotinicity. The delay cell may be used as a building module which is repeatedly used in a serial fashion. The delay range is fully programmable from the delay of one delay cell to infinity if the chip area is available. The delay range can be scaled by adding more delay cells.

26 Claims, 4 Drawing Sheets

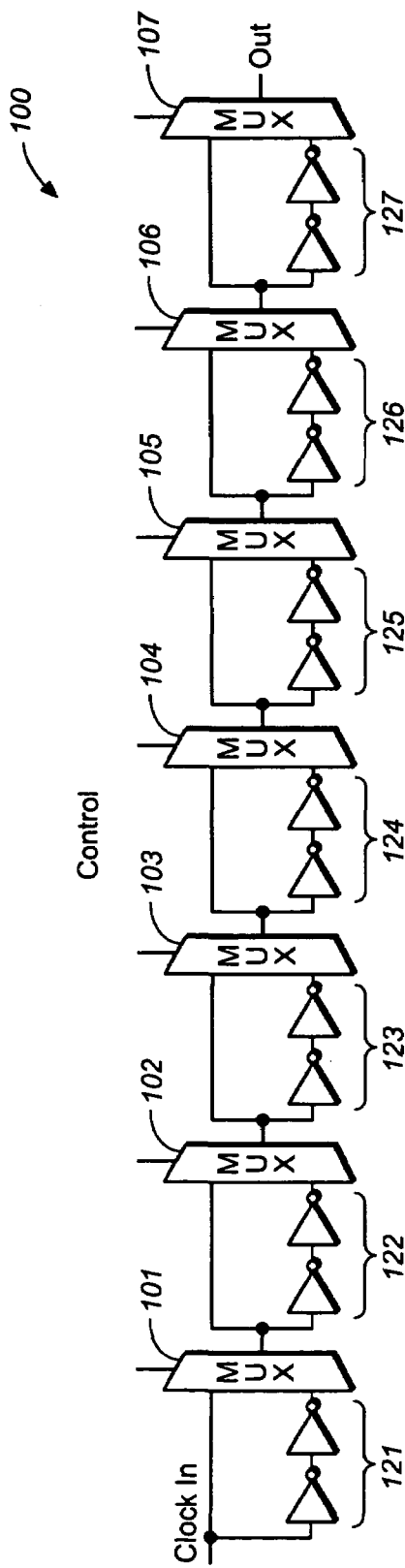
FIG._1A
(PRIOR ART)
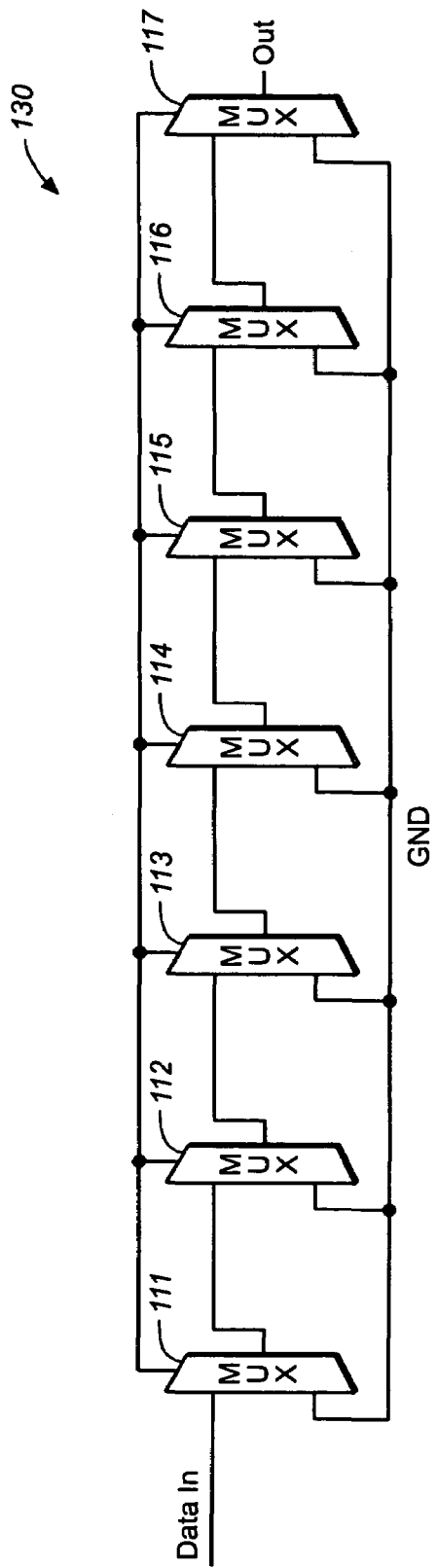
FIG._1B
(PRIOR ART)

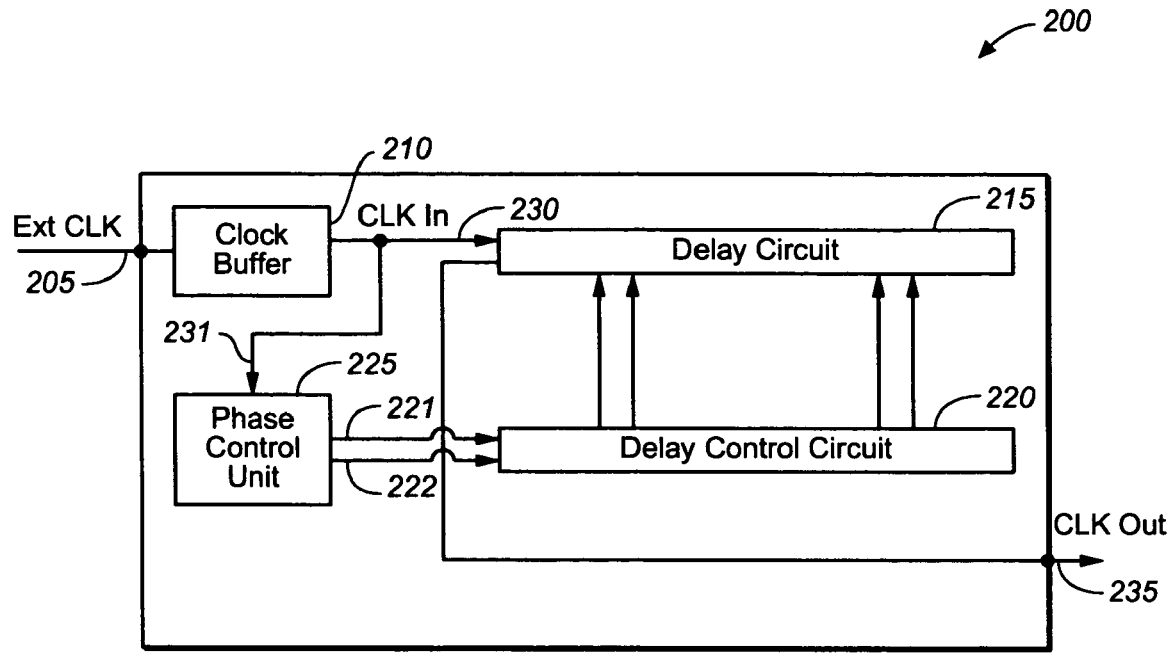
FIG._2
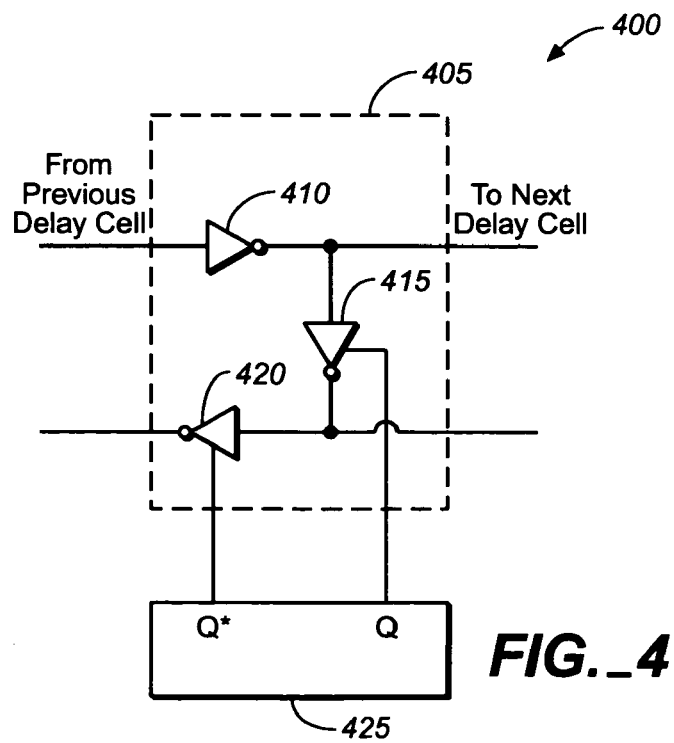
FIG._4

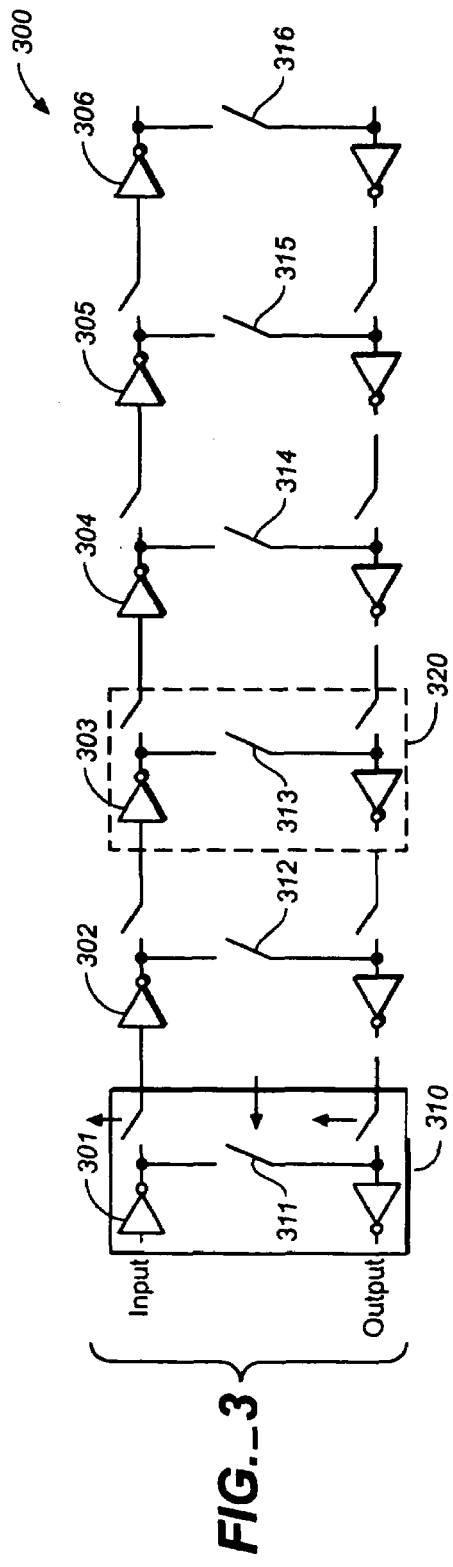
FIG._3
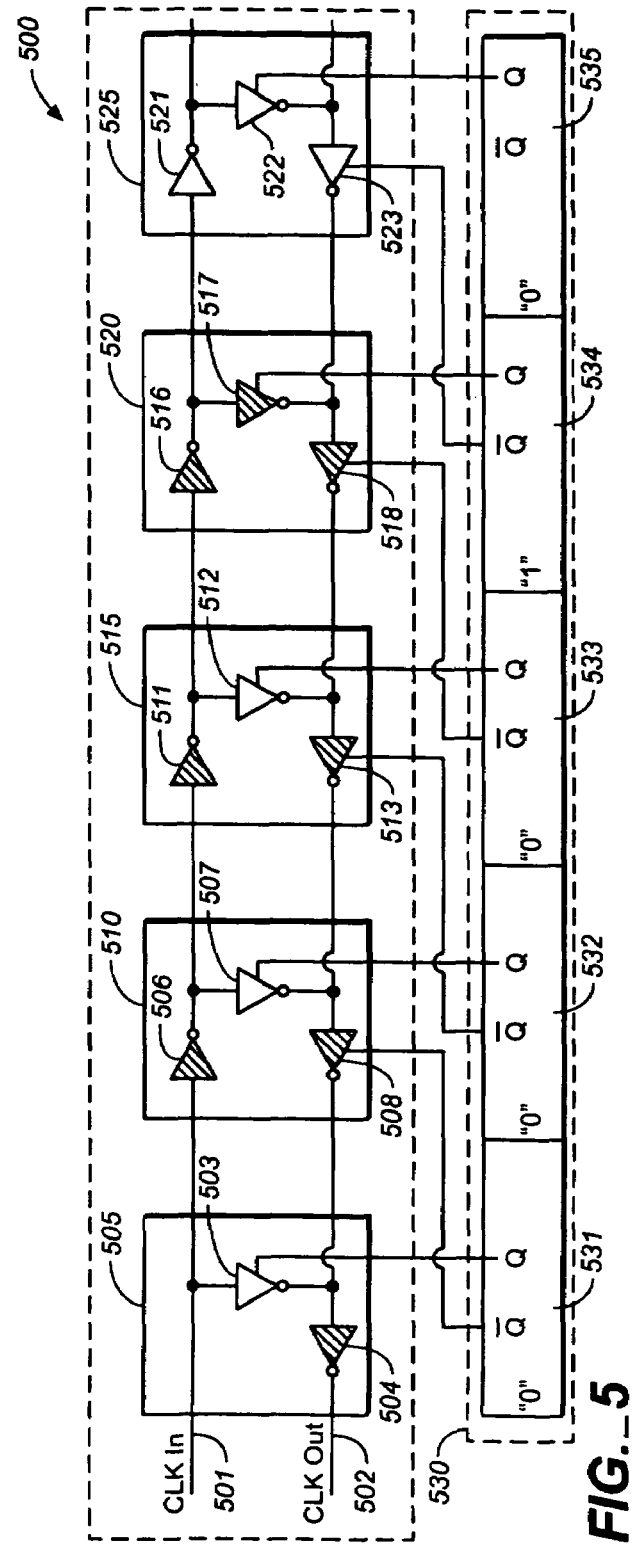
FIG._5

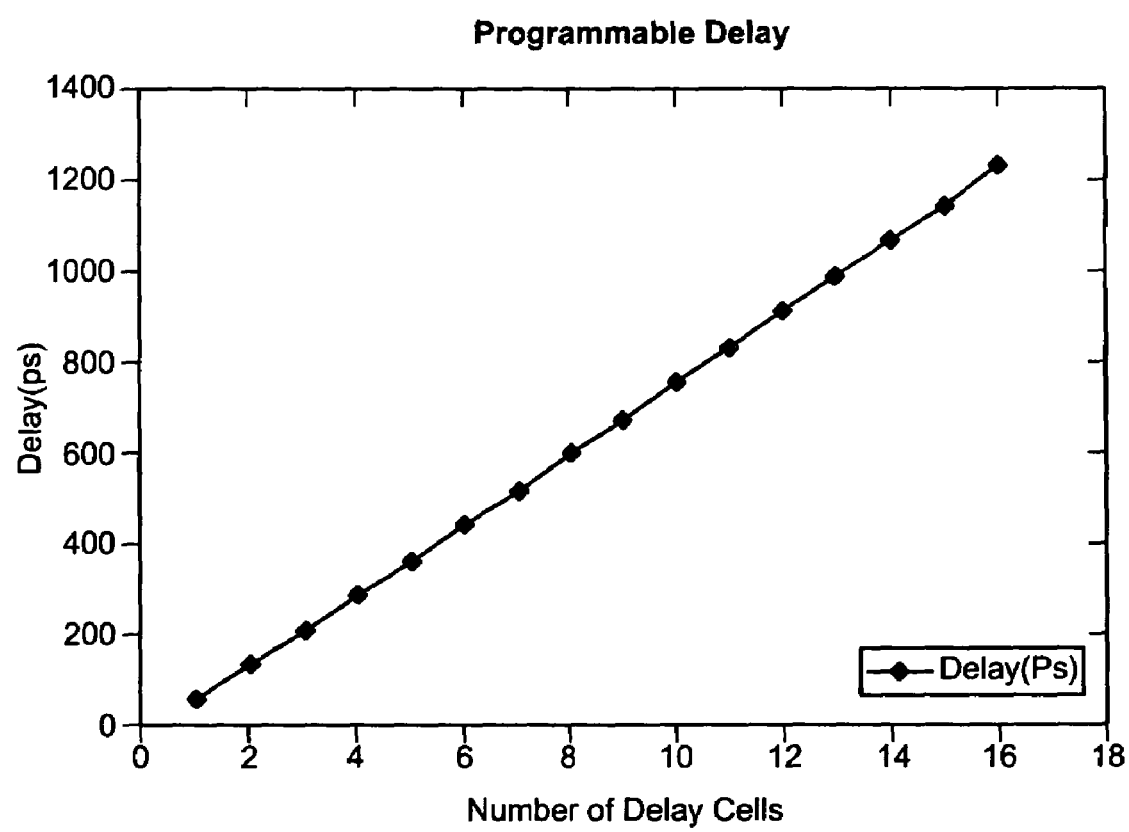
FIG._6

HIGH SPEED FULLY SCALEABLE, PROGRAMMABLE AND LINEAR DIGITAL DELAY CIRCUIT

FIELD OF THE INVENTION

The present invention generally relates to the field of clock circuits, and particularly to a digitally programmable delay circuit in an integrated circuit.

BACKGROUND OF THE INVENTION

In recent years, there has been a great use of various delay architectures for delaying digital signals in integrated circuit (IC) devices. Many clock alignment circuits have been included in the IC devices to provide internal on-chip clocks that are aligned in phase with an external system clock. For example, digital delay locked loops (DLL's) for clock alignment are commonly used in some IC devices (such as a CMOS) which have stringent timing requirements in a high speed memory system.

Digital DLL's are characterized by their use of a digital delay line (a digital delay circuit) and are typically made from simple digital circuit elements such as inverters, multiplexers and the like. The delay line (delay circuit) is a core part of a DLL, which has a number of delay cells connected in series. Typically, the last cell in the delay line connects to a node designated to be a clock output of the DLL. One or more delay cells may receive an external clock signal. After the external clock signal enters in the delay line, each delay cell passes the clock signal to achieve a proper adjusted clock signal.

There are various architectures to construct delay circuits. One of delay circuit architectures may use digital delay cells comprising inverters or buffers with multiplexers. For example, FIG. 1A shows a typical architecture of delay circuits comprising inverters and multiplexers. A problem with the conventional delay circuit is matching between delay cells (inverter or buffer) and multiplexers. Since an inverter and a multiplexer are two different types of architecture, the inverter's delay and the multiplexers' delay are different and therefore hard to match. In such case, overall delay of the delay circuit is not linear so that the design of the delay circuit becomes more complicated. Another problem with the conventional delay circuit may be an intrinsic delay in the delay circuit. The intrinsic delay (the delay which the delay circuit starts with) is too big to make the delay circuit usable in applications where small intrinsic delay is required. To overcome the intrinsic delay problem, dummy multiplexers are added to data bits to cancel out intrinsic delay in addition to the clock side. For example, FIG. 1B shows a typical architecture of a data side delay comprising dummy multiplexers. However, this approach may waste IC chip space and also create great complexity in designing IC chips.

Therefore, it would be desirable to provide a digital delay circuit with a small intrinsic delay suitable for an IC device with stringent timing requirements, which is simple to implement, fully scaleable and linear.

SUMMARY OF THE INVENTION

Accordingly, the present invention provides a fully scaleable, programmable, linear digital delay circuit comprising a plurality of digital delay cells and a delay control circuit which corrects timing skew between clock and data in source synchronous architectures.

In the present invention, the delay circuit may be built by cascading delay cells. The delay control circuit, coupled to delay cells, may be operable to select a clock signal path in the delay circuit. Input/output delay cell in the delay circuit may receive an external clock from the clock source and send an adjusted clock signal which has been generated through the delay circuit. The input/output delay cell may comprise a common inverter and a tri-state inverter. Other delay cells may comprise an inverter, a second tri-state inverter, and a first tri-state inverter. The inverter may receive a clock signal from a previous delay cell and pass the clock signal to a next delay cell. The inverter may also pass the clock signal to the second tri-state inverter when the second tri-state inverter is turned on by the delay control circuit. The first tri-state inverter may pass the clock signal to the previous delay cell and receives the clock signal from the next delay cell or the second tri-state inverter. The second tri-state inverter may have one input from the delay control circuit, one input from the inverter and one output to the first tri-state inverter, wherein the second tri-state inverter and the first tri-state inverter may be turned on/off by the selecting signal from the delay control circuit. The first and second tri-state inverters share the same architecture.

In an advantageous aspect of the present invention, the delay circuit does not require any multiplexer to bypass delay cells. The delay range is fully programmable from the delay of one delay cell to infinity if the chip area is available. The delay range can be scaled by adding more delay cells. In another advantageous aspect of the present invention, the characteristics of the developed delay circuit are linear and monotonic because the delay cell may be used as a building module which is repeatedly used in a serial fashion.

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIGS. 1A, 1B are illustrations of a block diagram of conventional delay circuit architecture;

FIG. 2 is an illustration of a block diagram of a digital delay lock loop incorporating a delay circuit in accordance with the present invention;

FIG. 3 is an illustration of a delay circuit in accordance with an exemplary embodiment of the present invention;

FIG. 4 is a schematic diagram of a delay cell in accordance with an exemplary embodiment of the present invention;

FIG. 5 is an illustration of a schematic diagram of the delay circuit in accordance with an exemplary embodiment of the present invention; and FIG. 6 is a graph showing the performance of a simulated delay circuit in accordance with an exemplary embodiment of the present invention.

DETAILED DESCRIPTION OF THE INVENTION

Reference will now be made in detail to the presently preferred embodiments of the invention, examples of which are illustrated in the accompanying drawings.

FIGS. 1A and 1B show one of the conventional approaches to resolve the timing skew problem between data and clock using a digitally programmable delay circuit. In FIG. 1A, the clock side delay circuit 100 may comprise a plurality of digital inverter circuits 121–127 and corresponding multiplexers 101–107. The multiplexers 101–107 may be a digital multiplexer, an analog multiplexer, or the like. The intrinsic delay may become big since multiplexers are serially combined. Consequently, the delay cell may not be usable in applications where small intrinsic delay is required. In FIG. 1A, this intrinsic delay problem may be overcome by having a data side delay 130 comprising dummy multiplexers 111–117 in order to cancel out intrinsic delay generated in the clock side delay circuit 100. In other words, additional delays will be added to data bits (in order to sync). Each data bit may require an extra dummy multiplexer to cancel out intrinsic delay. For example, when the data has 16 bits (16 bits are common for many applications), 16 times of dummy multiplexers per data bit may be required to be added. Therefore, this architecture will occupy a large area of an IC chip.

A digital delay locked loop (DLL) 200 incorporating the present invention generally includes at least one delay circuit 215, a clock buffer 210, a phase control unit 225, and a delay control circuit 220, as shown in FIG. 2. Usually, the DLL is included in the IC chip to provide internal on-chip clocks that are aligned in phase with an external system clock. There are various circuit components which must be synchronized in order to cooperate together to perform a particular logic function of the IC device. The clock buffer 210 may receive an external clock signal 205 and feed clock signals 230–231 to the delay circuit 215 and the phase control unit 225. The phase control unit 225 may send a delay control command to the delay control circuit 220 in order to generate an adjusted internal clock signal. Based on the delay control command, the delay control circuit 220 may select a desired path in the delay circuit 215. For example, the phase control unit 225 may send delay increase signal 221 or delay decrease signal 222 to shift registers (not shown) in the delay control circuit. After being passed through the path in the delay circuit, the internal clock signal becomes aligned in phase with the external clock signal. The delay circuit 215 outputs an adjusted internal clock signal 235 to the various circuit components in the IC device. Referring now to FIG. 3, a delay circuit 300 in accordance with an exemplary embodiment of the present invention is shown. The delay circuit 300 may comprise a plurality of delay cells including a plurality of inverters 301–306 and switches 311–316. In the delay circuit 300, the intrinsic delay may be a first stage delay from a first delay cell 310 because, at minimum delay setting, only the fist delay cell may be on. In an advantageous aspect of the present invention, the delay circuit 300 may have very small intrinsic delay since the architecture of the delay circuit 300 includes digital circuit elements such as inverters 301–306 and switches 311–316. The delay circuit 300 may not require any multiplexer to bypass delay cells. Since there is no delay due to multiplexers added to the delay circuit, it may not be necessary to add any dummy cells (multiplexers) to data bits. Additionally, the elimination of dummy cells to cancel out intrinsic delay may simplify the design and layout of IC chips. In another advantageous aspect of the present invention, a delay range is fully programmable from the delay of one delay cell to infinity if the chip area is available. Depending on the requirement, the delay range can be scaled by adding more delay cells or slowing down the speed of the delay cell (adding more digital circuit elements in the delay cell or making inverters slow). The delay range provided by the delay circuit 300 may be extended as much as required by cascading delay cells. In other words, there is no limit on how much delay range can be extended (fully scalable). In another advantageous aspect of the present invention, the delay circuit may have predictable linearity and monotonicity. Since the same delay cells are kept cascading, linearity and monotonicity of the delay circuit are always guaranteed. Preferably, the rise and fall time of the inverter may be closely matched.

In an alternative embodiment, one delay cell with bigger delay and one delay cell with smaller delay may be alternated in case the rise and fall time mismatches. If the requirement can afford two times of the delay step and intrinsic delay, the delay circuit may use every other one of a delay cell with bigger delay and a delay cell with smaller delay. Such delay circuit architecture may guarantees perfect linearity because the sum of bigger delay and small delay may be same at the output of every other delay cell. Usually, the time difference of bigger and smaller delay is around 10 picoseconds (Ps) if rise and fall time is reasonably optimized. Conventionally, for most of the digital applications, 10 ps of delay step mismatch may be irrelevant.

Referring now to FIG. 4, an exemplary delay cell 400 in accordance with the present invention is shown. Tri-state inverting logic circuits 415, 420 may be employed instead of switches 311–316 in FIG. 3 to eliminate switch resistance and capacitance which may slow down the delay circuit. The tri-state inverting logic circuit may include a tri-state inverter, a tri-state NOT gate or the like. The delay cell 400 may comprise a inverting logic circuit 410, a second tri-state inverting logic circuit 415, and a first tri-state inverting logic circuit 420 which may be connected each other. The inverting logic circuit may include an inverter, a NOT gate or the like. A clock signal may pass through the inverting logic circuit 410 from previous delay cell to next delay cell. When the second tri-state inverting logic circuit 415 is turned on by the delay control circuit 425, the clock signal may pass through the inverting logic circuit 410 to the first tri-state inverting logic circuit 420 via the second tri-state inverting logic circuit 415. The delay control circuit may turn on/off the second tri-state inverting logic circuit and the first tri-state inverting logic circuit in the delay cell in order to select a clock signal path.

Referring now to FIG. 5, an exemplary delay circuit 500 in accordance with the present invention is shown. The delay circuit 500 may comprise an input/output delay cell 505 and a plurality of delay cells 510, 515, 520 and 525. The input/output delay cell 505 may receive an external clock signal 501 and output an adjusted clock signal 502. In order to have a consistent delay difference (one inverter delay plus one tri-state inverter delay) among delay cells, the input/output delay cell 505 may comprise a tri-state inverter 503 and a common inverter 504. A delay cell 510, 515, 520 and 525 may comprise an inverter 506, 511, 516 and 521, a first tri-state inverter 508, 513, 518, and 523 and a second tri-state inverter 503, 507, 512, 517, and 522. The variable delay control circuits may be implemented. One example of delay control circuits may include a shift register receiving decoding bits. A shift register is a high-speed circuit that holds some number of bits for the purpose of shifting them left or right. Another example may include several decoding schemes.

In an exemplary embodiment of the present invention, a delay control circuit 530 may receive a delay control command with a decoding code consisting of series of bits. Each bit of the decoding code may turn on or turn off the second tri-state inverter 503, 507, 512, 517, and 522 and the first tri-state inverter 508, 513, 518, and 523 in the corresponding delay cell. For example, the second tri-state inverter 517 is turned on by the delay control circuit having the logic "1" in decoding bit 534. Other decoding bits 531, 532, 533, and 535 may have the logic "0". Reverse output of decoding bit 531, 532, 533 may be the logic "1", which will turn on corresponding first tri-state inverters 508, 513, 518. Alternatively, the delay control circuit may include separate decoding schemes for first tri-state inverters and second tri-state inverters. The signal path may follow the path of inverter 506, inverter 511, inverter 516, second tri-state inverter 517, first tri-state inverter 518, first tri-state inverter 513, first tri-state inverter 508, and common inverter 504. The common inverter 504 in the input/output delay cell 505 may be used by all signal paths. The common inverter 504 may be an entry for outputting an adjusted clock. Including the common inverter 504, all inverters 506, 511, 516 and 521 may be always turned on.

In an advantageous aspect of the present invention, the characteristics of the developed delay circuit are linear and monotonic because the same building modules (delay cells) may be repeatedly used. Additionally, since the delay cell uses only simple digital circuit elements like one inverter and two tri-state inverters in one building block (a delay cell), the delay circuit can be used with digital design environment to correct timing skew between clock and data in source synchronous architectures.

FIG. 6 shows a graph 600 illustrating the performance of the delay cells in accordance with an exemplary delay circuit of the present invention. The exemplary delay circuit may be simulated to comprise 16 delay cells illustrated in FIGS. 3–4. The 0.13 um CMOS process is used to design the delay circuit. The simulation results shows that delay cells are fully programmable form the second delay cell to $16^{th}$ delay cell without degrading linearity and monotonicity. The intrinsic delay is only 60 ps equivalent of one delay cell.

In the exemplary embodiments, the methods disclosed may be implemented as sets of instructions or software readable by a device. Further, it is understood that the specific order or hierarchy of steps in the methods disclosed are examples of exemplary approaches. Based upon design preferences, it is understood that the specific order or hierarchy of steps in the method can be rearranged while remaining within the scope and spirit of the present invention. The accompanying method claims present elements of the various steps in a sample order, and are not necessarily meant to be limited to the specific order or hierarchy presented.

It is believed that the high speed fully scaleable, programmable and linear digital delay circuit of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. A delay circuit producing an output clock signal, said delay circuit comprising:
    a plurality of delay cells arranged in series with each other, said plurality of delay cells including an input/output delay cell which receives an external clock signal and outputs an adjusted clock signal, the plurality of delay cells having at least two delay cells with different delays, the plurality of delay cells being configured so that a first delay cell of the at least two delay cells with different delays is alternated with a second delay cell of the at least two delay cells with different delays for ensuring linearity;
    a delay control circuit coupled to said plurality of delay cells, said delay control circuit being operable to select a clock signal path in said delay circuit when receiving at least one delay command signal,
    wherein each of said plurality of delay cells comprises at least one inverting logic circuit and at least one tri-state inverting logic circuit,
    wherein said delay command signal includes decoding code, said decoding code further including a plurality of bits, a bit included in the plurality of bits being configured for powering the at least one tri-state inverting logic circuit on and off,
    wherein the delay circuit is configured for having an intrinsic delay for the delay circuit equivalent to a minimum intrinsic delay of a single delay cell included in the plurality of delay cells of the delay circuit.

2. The delay circuit as claimed in claim 1, said input/output delay cell further comprising:
    a tri-state logic inverting circuit having one input from said external clock signal and one input from said delay control circuit coupled to said input/output delay cell; and
    an inverting logic circuit receiving said clock signal from one of said plurality of delay cells and outputting said adjusted clock signal,
    wherein said tri-state inverting logic circuit passes said clock signal to said inverting logic circuit when said delay control circuit turns on said tri state logic circuit.

3. The delay circuit as claimed in claim 1, said delay cell further comprising,
    a inverting logic circuit receiving a clock signal from a previous delay cell and passing said signal to a next delay cell;
    a first tri-state inverting logic circuit passing said clock signal to said previous delay cell and receiving said clock signal from said next delay cell; and
    a second tri-state inverting logic circuit having one input from said delay control circuit, one input from said inverting logic circuit and one output to said first tri-state inverting logic circuit, said second tri-state inverting logic circuit passing said clock signal from said inverting logic circuit to said first tri-state inverting logic circuit when said delay control circuit turns on said second tri-state inverting logic circuit.

4. The delay circuit as claimed in claim 1, wherein said delay control circuit generates a delay control signal to select said clock signal path upon reception of the at least one delay command signal.

5. The delay circuit as claimed in claim 4, wherein said the delay control circuit turns on said first tri-state inverting logic circuit in each said delay cell in said clock signal path.

6. The delay circuit as claimed in claim 4, wherein said the delay control circuit turns on said second tri-state inverting logic circuit in one delay cell in said clock signal path.

7. The delay circuit as claimed in claim 1, wherein said inverting logic circuit includes a NOT gate.

8. The delay circuit as claimed in claim 1, wherein said tri-state inverting logic circuit includes a tri-state NOT gate.

9. The delay circuit as claimed in claim 1, wherein each said delay cell has a delay difference equal to a total of said inverting logic circuit delay and said tri-state inverting logic circuit delay.

10. A method of correcting time skew between a clock and a data in an integrated circuit having a programmable delay circuit producing an adjusted internal clock signal, comprising the steps of:
   receiving an external clock signal;
   feeding said external clock signal into a delay circuit and a phase control unit;
   selecting a clock signal path in said delay circuit based on a delay command from said phase control unit to a delay control circuit;
   generating said adjusted internal clock by passing said external clock signal though a selected said clock signal path in said delay circuit; and
   outputting said adjusted internal clock signal generated in said delay circuit;
   wherein said delay circuit comprises a plurality of delay cells arranged in series with each other, said delay cell comprises at least one inverting logic circuit and at least one tri-state inverting logic circuit, the plurality of delay cells having at least two delay cells with different delays, the plurality of delay cells being configured so that a first delay cell of the at least two delay cells with different delays is alternated with a second delay cell of the at least two delay cells with different delays for ensuring linearity;
   wherein said delay command includes decoding code, said decoding code further including a plurality of bits, a bit included in the plurality of bits being configured for powering the at least one tri-state inverting logic circuit on and off,
   wherein the delay circuit is configured for having an intrinsic delay for the delay circuit equivalent to a minimum intrinsic delay of a single delay cell included in the plurality of delay cells of the delay circuit.

11. The method as claimed in claim 10, wherein: said delay cell includes an input/output delay cell; and said input/output delay cell includes:
   a tri-state inverting logic circuit having one input from said external clock signal and one input from said delay control circuit connected to said input/output delay cell; and
   an inverting logic circuit receiving said clock signal from one of said plurality of delay cells and outputting said adjusted clock signal,
   wherein said tri-state inverting logic circuit turned on by said delay control circuit passes said clock signal to said inverting logic circuit.

12. The method as claimed in claim 10, said selecting a clock signal path step further comprising the steps of:
   turning on said second tri-state inverting logic circuit in a selected delay cell; and
   turning on said first tri-state inverting logic circuit along said selected path in said delay circuit.

13. The method as claimed in claim 10, wherein said delay control circuit includes at least one shift register.

14. The method as claimed in claim 10, wherein said inverting logic circuit includes a NOT gate.

15. The method as claimed in claim 10, wherein said tri-state inverting logic circuit includes a tri-state NOT gate.

16. The method as claimed in claim 10, wherein each said delay cell has a delay difference equal to a total of said inverting logic circuit delay and said tri-state inverting logic circuit delay.

17. A digitally programmable delay circuit producing an adjusted clock signal, said digitally programmable delay circuit comprising:
   means for receiving an external clock signal;
   means for feeding said external clock signal into a delay circuit and a phase control unit;
   means for selecting a clock signal path in said delay circuit based on a delay command from said phase control unit to a delay control circuit;
   means for passing said external clock signal though a selected said clock signal path in said delay circuit; and
   means for outputting said adjusted internal clock signal generated in said delay circuit,
   wherein said delay circuit consists of a plurality of delay cells arranged in series with each other, said delay cell includes at least one inverting logic circuit and at least one tri-state inverting logic circuit, the plurality of delay cells having at least two delay cells with different delays, the plurality of delay cells being configured so that a first delay cell of the at least two delay cells with different delays is alternated with a second delay cell of the at least two delay cells with different delays for ensuring linearity
   wherein said delay command includes decoding code, said decoding code further including a plurality of bits, a bit included in the plurality of bits being configured for powering the at least one tri-state inverting logic circuit on and off,
   wherein the delay circuit is configured for having an intrinsic delay for the delay circuit equivalent to a minimum intrinsic delay of a single delay cell included in the plurality of delay cells of the delay circuit.

18. The digitally programmable delay circuit as claimed in claim 17, wherein said delay cell includes an input/output delay cell; and
   said input/output delay cell includes:
      a tri-state inverting logic circuit having one input from said external clock signal and one input from said delay control circuit connected to said input/output delay cell; and
      an inverting logic circuit receiving said clock signal from one of said plurality of delay cells and outputting said adjusted clock signal,
      wherein said tri-state inverting logic circuit is connected to said inverting logic circuit.

19. The digitally programmable delay circuit as claimed in claim 18, further comprising:
   means for turning on said tri-state inverting logic circuit in said input/output delay cell.

20. The digitally programmable delay circuit as claimed in claim 17, said means for selecting a clock signal path further comprising:
   means for turning on said second tri-state inverting logic circuit in a selected delay cell; and
   means for turning on said first tri-state inverting logic circuit along said selected path in said delay circuit.

21. The digitally programmable delay circuit as claimed in claim 17, wherein said inverting logic circuit includes a NOT gate.

22. The digitally programmable delay circuit as claimed in claim 17, wherein said tri-state inverting logic circuit includes a tri-state NOT gate.

23. A digitally programmable delay circuit producing an output clock signal, said digitally programmable delay circuit comprising:
- a plurality of delay cells arranged in series with each other, each of said plurality of delay cells further comprising:
- a inverter receiving a signal from a previous delay cell and outputting said signal to a next delay cell;
- a first tri-state inverter outputting said signal to said previous delay cell and receiving said signal from said next delay cell;
- a second tri-state inverter having one input from said delay control circuit, one input from said inverter and one output to said first tri-state inverter, said second tri-state inverter passing said signal from said inverter to said first tri-state inverter when said delay control circuit turns on said second tri-state inverter;
- an input/output delay cell connected to one of said plurality of delay cells, said input/output delay cell receiving an external clock signal and outputting an adjusted clock signal;
- a phase control unit configured for receiving a clock signal from a clock buffer, the phase control unit being further configured for sending a delay command, the delay command including at least one of a delay increase signal and a delay decrease signal in order to align internal clock phase with an external system clock; and
- a delay control circuit, coupled to said plurality of delay cells, receiving said delay command from said phase control unit, said delay control circuit operable to select a clock signal path in said digitally programmable delay circuit.

24. The digitally programmable delay circuit as claimed in claim 23, said input/output delay cell further comprising,
- a tri-state inverter having one input from said input clock signal and one input from said delay circuit connected to said input/output delay cell; and
- a common inverter outputting said adjusted clock signal, said common inverter receiving said signal from said tri-state inverter.

25. The digitally programmable delay circuit as claimed in claim 23, wherein said delay control circuit selects said clock signal path based on delay code bits.

26. The digitally programmable delay circuit as claimed in claim 23, wherein said delay control circuit includes at least one shift registers.

* * * * *